(12) United States Patent
Bick et al.

(10) Patent No.: US 9,282,654 B2
(45) Date of Patent: Mar. 8, 2016

(54) HVAC CONTROLLER WITH AIR FLOW BARRIER

(71) Applicant: Honeywell International Inc., Morristown, NJ (US)

(72) Inventors: Robert Bick, Eagan, MN (US); Brad Terlson, Maple Grove, MN (US); Mark E. Stout, Maple Grove, MN (US); Mark Ekblad, North Oaks, MN (US); Eugene J. Takach, Eden Prairie, MN (US); Steven L. Wolff, Hamel, WI (US); David J. Emmons, Plymouth, MN (US); Travis Read, Little Canada, MN (US)

(73) Assignee: Honeywell International Inc., Morris Plains, NJ (US)

( * ) Notice: Subject to any disclaimer, the term of this patent is extended or adjusted under 35 U.S.C. 154(b) by 113 days.

(21) Appl. No.: 14/271,184

(22) Filed: May 6, 2014

(65) Prior Publication Data

US 2015/0327375 A1     Nov. 12, 2015

(51) Int. Cl.
*H05K 5/06* (2006.01)
*H05K 5/00* (2006.01)
*H02G 3/10* (2006.01)

(52) U.S. Cl.
CPC .............. *H05K 5/0017* (2013.01); *H02G 3/10* (2013.01); *H05K 5/0004* (2013.01); *H05K 5/06* (2013.01)

(58) Field of Classification Search
USPC .......................................................... 174/563
See application file for complete search history.

(56) References Cited

U.S. PATENT DOCUMENTS

| | | | |
|---|---|---|---|
| 2,558,610 A | 6/1951 | Diekhoff | |
| 2,599,569 A | 6/1952 | McLarty | |
| 3,580,988 A | 5/1971 | Schroeder et al. | |
| 4,163,137 A * | 7/1979 | Close, Jr. ............... | H02G 3/123 174/66 |
| 4,347,443 A | 8/1982 | Whitney | |

(Continued)

FOREIGN PATENT DOCUMENTS

| | | |
|---|---|---|
| EP | 1017263 B1 | 9/2003 |
| JP | 11045629 A | 2/1999 |

(Continued)

OTHER PUBLICATIONS

McQuay, "Forced Draft Gas Fired Furnace for Use is McQuay Rooftop R*S Units "C" Vintage Units Models FB****A* With R7795B Flame SafeGuard," SnyderGeneral Corporation, 16 pages, Jan. 1991. Installation and Maintenance Data Bulletin No. IM 484, Form No. 571478Y.

(Continued)

*Primary Examiner* — Dhirubhai R Patel
(74) *Attorney, Agent, or Firm* — Seager, Tufte & Wickem LLP

(57) ABSTRACT

A wall plate assembly for an HVAC controller may include a rear plate including an aperture extending through the rear plate and a front plate securable to the rear plate. In some cases, the front plate may have a recessed portion that is recessed back toward the rear plate and align with the aperture in the rear plate. An air flow barrier may be secured to the recessed portion of the front plate. The air flow barrier may include a barrier surface that covers a portion of the aperture formed in the recessed portion of the front plate to reduce air infiltration. The air flow barrier may include an air flow barrier aperture that is sized to accommodate wires passing through the aperture in the recessed portion of the front plate for connection to a wire connection block of the front plate.

7 Claims, 8 Drawing Sheets

(56) References Cited

U.S. PATENT DOCUMENTS

| | | | |
|---|---|---|---|
| 4,470,267 A | 9/1984 | Davis et al. | |
| 4,657,215 A | 4/1987 | Murphy | |
| 4,757,158 A * | 7/1988 | Lentz | H02G 3/088 |
| | | | 174/53 |
| 5,022,766 A | 6/1991 | Phipps | |
| 5,155,300 A | 10/1992 | Brandner | |
| 6,031,181 A | 2/2000 | Jacks et al. | |
| 6,239,365 B1 * | 5/2001 | McEvers | H02G 3/088 |
| | | | 174/50 |
| 6,315,261 B1 | 11/2001 | Snyder | |
| 6,347,747 B1 | 2/2002 | Nesbitt | |
| 6,597,275 B2 | 7/2003 | Morrow et al. | |
| 6,837,008 B2 * | 1/2005 | Roberts | A01M 29/34 |
| | | | 174/480 |
| 7,617,988 B2 | 11/2009 | Morrow et al. | |
| 2005/0043907 A1 | 2/2005 | Eckel et al. | |
| 2012/0228021 A1 | 9/2012 | Sawayanagi | |

FOREIGN PATENT DOCUMENTS

| | | |
|---|---|---|
| JP | 2002260772 A | 9/2002 |
| JP | 2009189098 A | 8/2009 |

OTHER PUBLICATIONS

"Fix-DGB, Fix and Fasten" Downloaded Apr. 21, 2014. FIX-DGB-19, FIX-DGB-19A, FIX-DGB-25, FIX-DGB-26.

* cited by examiner

HVAC CONTROLLER WITH AIR FLOW BARRIER

BACKGROUND

Heating, ventilation, and/or air conditioning (HVAC) systems are often used to control the comfort level within a building or other structure. Such HVAC systems typically include an HVAC controller that controls various HVAC components of the HVAC system in order to affect and/or control one or more environmental conditions within the building.

Many HVAC controllers have a wall plate that is separable from an HVAC controller body. The wall plate is typically secured to a wall in the building, and then the HVAC controller body is secured to the wall plate. When the wall plate is secured to the wall, wires extending from an HVAC system often exit the wall through a roughly-formed hole that is frequently larger than is strictly necessary to accommodate the wires themselves. In some cases, particularly when the fan of the HVAC system is running and/or when the fan cycles on and off, there can be air pressure changes within the wall relative to the air pressure in the room, meaning that positive or negative air currents may form in and near the hole in the wall.

In some embodiments, air can be pulled out of an HVAC controller in a negative wall pressure case. It will be appreciated that air pressure in the wall can be expressed as a negative pressure condition, i.e., the pressure in the wall is less than the ambient pressure, or a positive pressure condition, i.e., the pressure in the wall is greater than the ambient pressure. In some cases, for example, a negative wall pressure condition can result if an installer runs HVAC control wires through a wall cavity being used as part of the return duct system.

Air currents, whether resulting from a positive wall pressure condition or a negative wall pressure condition, can potentially interfere with temperature readings taken by one or more temperature sensors within the HVAC controller body, particularly when the air currents are allowed to approach and/or enter or exit the HVAC controller body. In some instances, when an HVAC controller is configured to compensate the internal temperature readings taken by the one or more internal temperature sensors to account for heat generation by components within the HVAC controller body, such air currents can interfere with the temperature compensation algorithm, which can reduce the temperature control accuracy of the HVAC controller, reduce the comfort provided to the user, and/or reduce the energy efficiency that can be achieved by the HVAC system.

SUMMARY

This disclosure relates generally to methods and apparatus for controlling an HVAC system, and more particularly to improvements in hardware, user experience, and functionality of an HVAC controller such as a thermostat.

In an illustrative but non-limiting example, the disclosure describes a wall plate assembly for an HVAC Controller. An illustrative wall plate assembly may include a rear plate including an aperture extending through the rear plate, and a front plate securable to the rear plate with one or more electrical components situated between the front plate and the rear plate. The front plate may have a recessed portion that is recessed toward the rear plate and that is configured to align with the aperture in the rear plate. The recessed portion of the front plate may include an aperture that is at least partially aligned with the aperture in the rear plate. The front plate may include a wire connection block, and a connector, both of which are accessible from the front of the wall plate assembly. The connector may be configured to provide electrical signals between the wall plate assembly and an HVAC controller when the HVAC controller is connected to the wall plate assembly. An air flow barrier may be secured to the recessed portion of the front plate. The air flow barrier may include a barrier surface that covers a portion of the aperture formed in the recessed portion of the front plate to reduce air infiltration into the HVAC controller or air exfiltration out of the HVAC controller. The air flow barrier may include an air flow barrier aperture that is sized to accommodate wires passing through the aperture in the recessed portion of the front plate and extending to the wire connection block of the front plate.

In another illustrative but non-limiting example, the disclosure describes a wall plate assembly for an HVAC controller. The wall plate assembly may include a front side and a back side that may have one or more wall engaging regions for engaging a wall. An aperture may be defined through an aperture defining region of the wall plate assembly that is spaced inward toward the front side from the one or more wall engaging regions of the back side of the wall plate assembly. One or more wiring terminals may be accessible from the front side of the wall plate assembly for connecting one or more wires, and an electrical connector may be situated on the front side of the wall plate assembly for electrically connecting to an electrical connector of the HVAC controller when the HVAC controller is secured to the wall plate assembly. An air flow barrier may be mechanically secured to the aperture defining region of the wall plate assembly and over the aperture in the wall plate assembly. The air flow barrier may define an air flow barrier aperture that is smaller than the aperture of the wall plate assembly and that at least partially overlaps the aperture of the wall plate assembly.

In another illustrative but non-limiting example, the disclosure describes an HVAC controller assembly that includes an HVAC controller having an electrical connector and a wall plate assembly having a front side and a back side. The HVAC controller assembly may be releasably securable to the wall plate assembly with the electrical connector of the HVAC controller facing the front side of the wall plate assembly. The wall plate assembly may include, on the back side of the wall plate assembly, one or more wall engaging regions for engaging a wall that the wall plate assembly is to be mounted to. An aperture may be defined through an aperture defining region of the wall plate assembly that is spaced inward toward the front side from the one or more wall engaging regions on the back side of the wall plate assembly. One or more wiring terminals may be accessible from the front side of the wall plate assembly for connecting one or more wires. An electrical connector may be situated on the front side of the wall plate assembly that is configured to electrically connect to the electrical connector of the HVAC controller when the HVAC controller is secured to the wall plate assembly. An air flow barrier may be mechanically secured to the aperture defining region of the wall plate assembly and over the aperture in the wall plate assembly. The air flow barrier may define an air flow barrier aperture that is smaller than the aperture of the wall plate assembly and that at least partially overlaps the aperture of the wall plate assembly.

The preceding summary is provided to facilitate an understanding of some of the innovative features unique to the present disclosure and is not intended to be a full description. A full appreciation of the disclosure can be gained by taking the entire specification, claims, drawings, and abstract as a whole.

Figure 1:
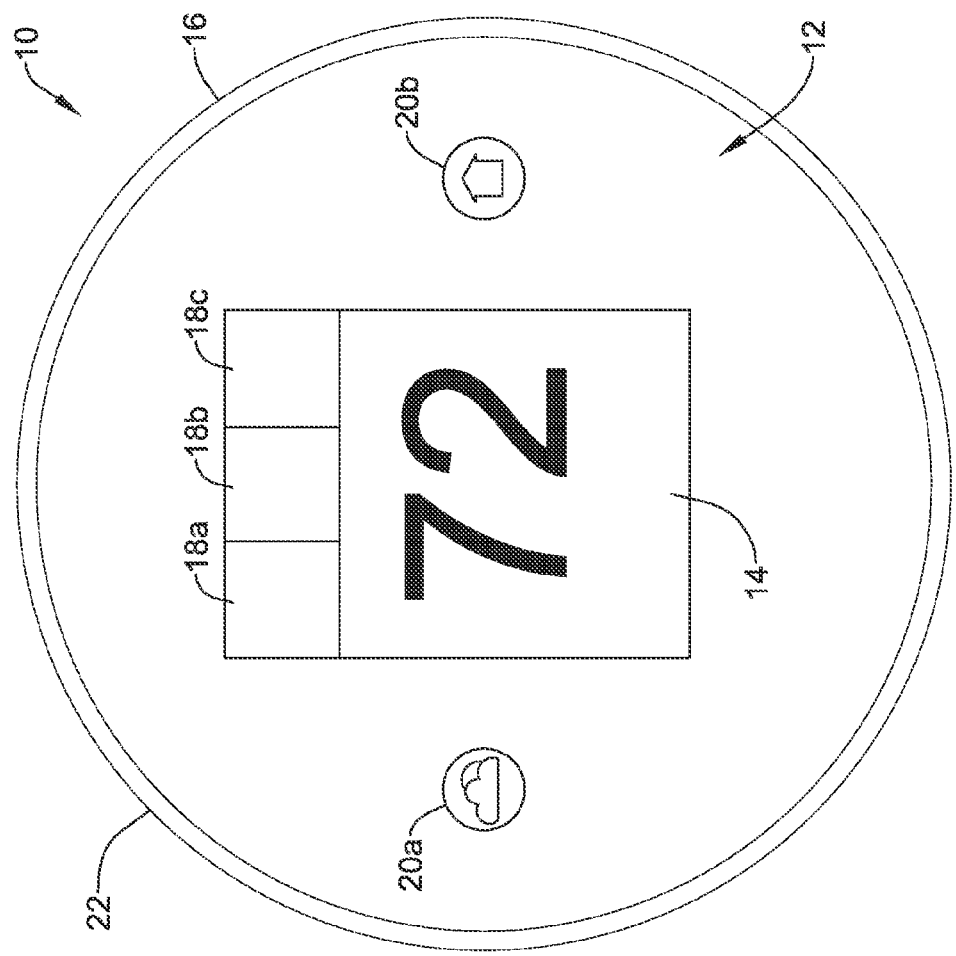
FIG. 1 is a front view of an HVAC controller in accordance with an illustrative embodiment of the present disclosure.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the disclosure.

DESCRIPTION

The following description should be read with reference to the drawings wherein like reference numerals indicate like elements within a group of figures having the same figure number. Like reference numeral will not necessarily indicate like elements across different figure numbers. The drawings, which are not necessarily to scale, are not intended to limit the scope of the disclosure. In some of the figures, elements not believed necessary to an understanding of relationships among illustrated components may have been omitted for clarity.

All numbers are herein assumed to be modified by the term "about." The recitation of numerical ranges by endpoints includes all numbers subsumed within that range (e.g., 1 to 5 includes 1, 1.5, 2, 2.75, 3, 3.80, 4, and 5).

As used in this specification and the appended claims, the singular forms "a", "an", and "the" include the plural referents unless the content clearly dictates otherwise. As used in this specification and the appended claims, the term "or" is generally employed in its sense including "and/or" unless the content clearly dictates otherwise.

It is noted that references in the specification to "an embodiment", "some embodiments", "other embodiments", "an illustrative embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is contemplated that the feature, structure, or characteristic may be applied to other embodiments whether or not explicitly described unless clearly stated to the contrary.

Within this disclosure, the terms "thermostat", "programmable thermostat", "WiFi enabled thermostat", "HVAC controller", and "device" may refer to an HVAC controller when the context makes clear that reference to the HVAC controller as a whole is intended. Although reference is specifically made to a programmable thermostat in portions of the description that follows, it should be appreciated that each of those descriptions may also apply to a programmable thermostat which may be expressly WiFi enabled even when the feature or features described do not expressly mention or require a communication link such as a WiFi connection.

FIG. 1 is a front view of an illustrative HVAC controller 10 that includes a user interface 12. In some instances, the HVAC controller 10 may be considered to be a programmable thermostat with an internal temperature sensor, although this is not required. As shown in FIG. 1, the user interface 12 may include a display 14 housed by a housing 16. In some cases, the display 14 may be a touch screen display, but this is not required. The user interface 12 may include one or more touch sensitive regions 18a, 18b, 18c provided on the display 14, each touch sensitive region defining a button through which the user may interact with the HVAC controller 10. Additionally or in alternatively, the user interface 12 may include one or more buttons 20a and 20b that may be provided separate from the display 14 through which the user may interact with the HVAC controller 10. In some cases, the buttons 20a, 20b may be touch sensitive capacitive buttons. In other cases, the buttons 20a, 20b may be hard, physical buttons or soft keys. It will be generally understood that the size and shape of the display as well as the number and location of the various buttons (if any) can vary.

The housing 16 may be fabricated from any suitable material. As shown in FIG. 1, the housing 16 may have a generally circular foot print, but this is not required. In some cases, the housing 16 may support a rotating ring 22 which may form part of the user interface 12, and which may provide a mechanism for accepting an input from a user. For example, in some instances, the user may rotate the ring 22 to increase or decrease an operating parameter (e.g. set point) or to change information viewed on the display 14 by advancing from a first screen to a second screen displayed on the display 14. While the user interface 12 that is provided at the HVAC controller 10 may be capable of receiving user interactions, in some cases a more advanced or detailed user interface 12 for more fully interacting with the HVAC controller 10 may be provided by an application program executed at a user's remote device (e.g. user's cell phone) and/or by one or more web pages served up by a web server.

The HVAC controller 10 may operate in accordance with an algorithm that controls or at least partially controls one or more HVAC components of an HVAC system. The HVAC controller 10 may, for example, operate in accordance with a control algorithm that provides temperature set point changes, humidity set point changes, schedule changes, start and end time changes, window frost protection setting changes, operating mode changes, and/or the like. At least a portion of the control algorithm may be stored locally in a memory of the HVAC controller 10 and, in some cases, may be received from an external web service. The control algorithm (or portion thereof) stored locally in the memory of the HVAC controller 10 may be periodically updated in accordance with a predetermined schedule (e.g. once every 24 hours, 48 hours, 72 hours, weekly, monthly, etc.), updated in response to any changes to the control algorithm (e.g. set point change) made by a user, and/or updated in response to a user's request. Moreover, and in some cases, updates to the control algorithm or portion of the control algorithm stored in the memory may be received from an external web service. In some cases, the control algorithm may include settings such as set points.

In some cases, the HVAC controller 10 may operate according to a first operating mode having a first temperature set point, a second operating mode having a second temperature set point, a third operating mode having a third temperature set point, and/or the like. In some cases, the first operating mode may correspond to an occupied mode and the second operating mode may correspond to an unoccupied mode. In some cases, the third operating mode may correspond to a holiday or vacation mode wherein the building or structure in which the HVAC system is located is expected to be unoccupied for an extended period of time. In other cases, the third operating mode may correspond to a sleep mode wherein the building occupants are either asleep or inactive for a period of time. These are just some examples. It will be understood that the HVAC controller 10 may be capable of operating in additional modes as necessary or desired. The number of operating modes and the operating parameter settings associated with each of the operating modes may be established locally through a local user interface 12, and/or through an external web service or other remote device and delivered to the HVAC controller 10 where they may be locally stored in memory of the HVAC controller 10.

In some cases, the HVAC controller 10 may operate according to one or more predetermined operating parameter settings associated with a user profile for an individual user. The user profile may be stored in the memory of the HVAC controller 10 and/or may be hosted by an external web service and stored on an external web server. The user profile may include one or more user-selected settings for one or more operating modes that may be designated by the user. For example, the HVAC controller 10 may operate according to a first operating mode having a first temperature set point associated with a first user profile, a second operating mode having a second temperature set point associated with the first user profile, a third operating mode having a third temperature set point associated with the first user profile, and/or the like. In some cases, the first operating mode may correspond to an occupied mode, the second operating mode may correspond to an unoccupied mode, and the third operating mode may correspond to a vacation or extended away mode wherein the building or structure in which the HVAC system is located may be unoccupied for an extended period of time. In some cases, multiple user profiles may be associated with the HVAC controller 10.

In some cases, the HVAC controller 10 may be programmed to execute a guided set-up routine that may guide a user through configuring the HVAC controller 10 to control one or more HVAC components of their particular HVAC system. In some cases, the user may have limited knowledge about the particular HVAC system configuration. The guided set-up routine may be configured to guide a user through set-up of the HVAC controller 10 without requiring detailed knowledge of the particular HVAC system and/or without requiring the user to consult a technical manual or guide. Further details pertaining to the programming and use of the illustrative HVAC controller 10 may be found in U.S. Provisional Application Ser. No. 61/914,877, filed Dec. 11, 2013, which is incorporated herein by reference in its entirety.

While the HVAC controller 10 is described with respect to a particular embodiment of HVAC controller 10, it will be appreciated that this description is illustrative only, as an HVAC controller 10 may take a variety of different physical shapes and configurations, and can include or exclude any variety of programming features.

Figure 2:
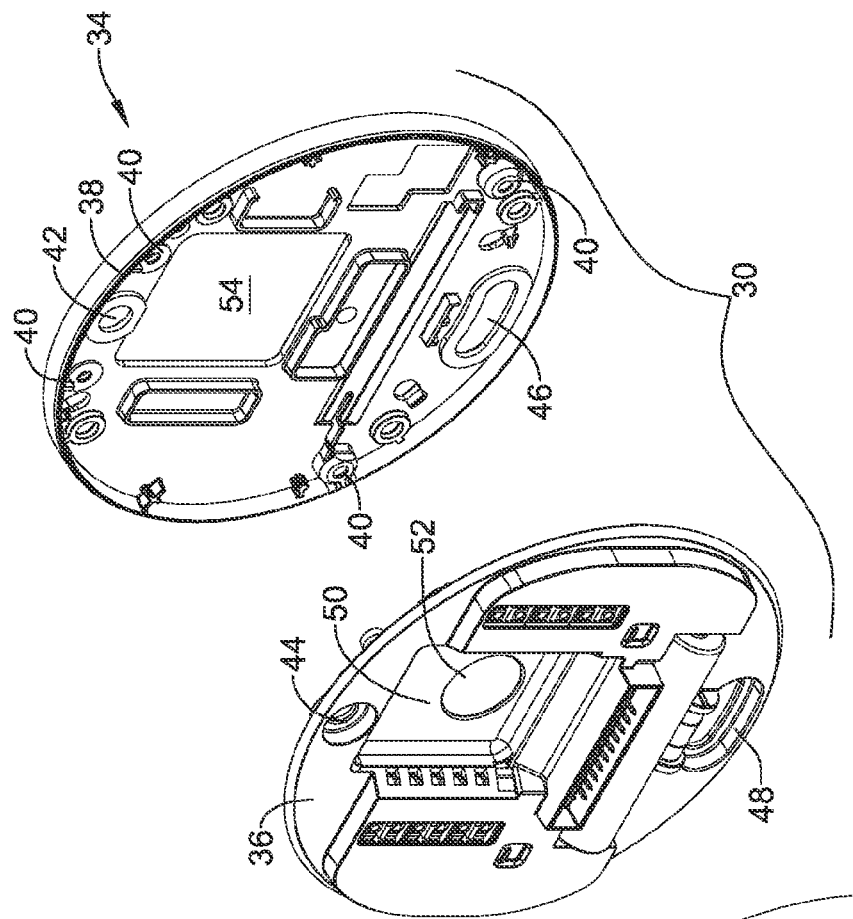
FIG. 2 is an exploded perspective view of the illustrative HVAC controller of FIG. 1, with includes an illustrative wall plate assembly.
Figure 3:
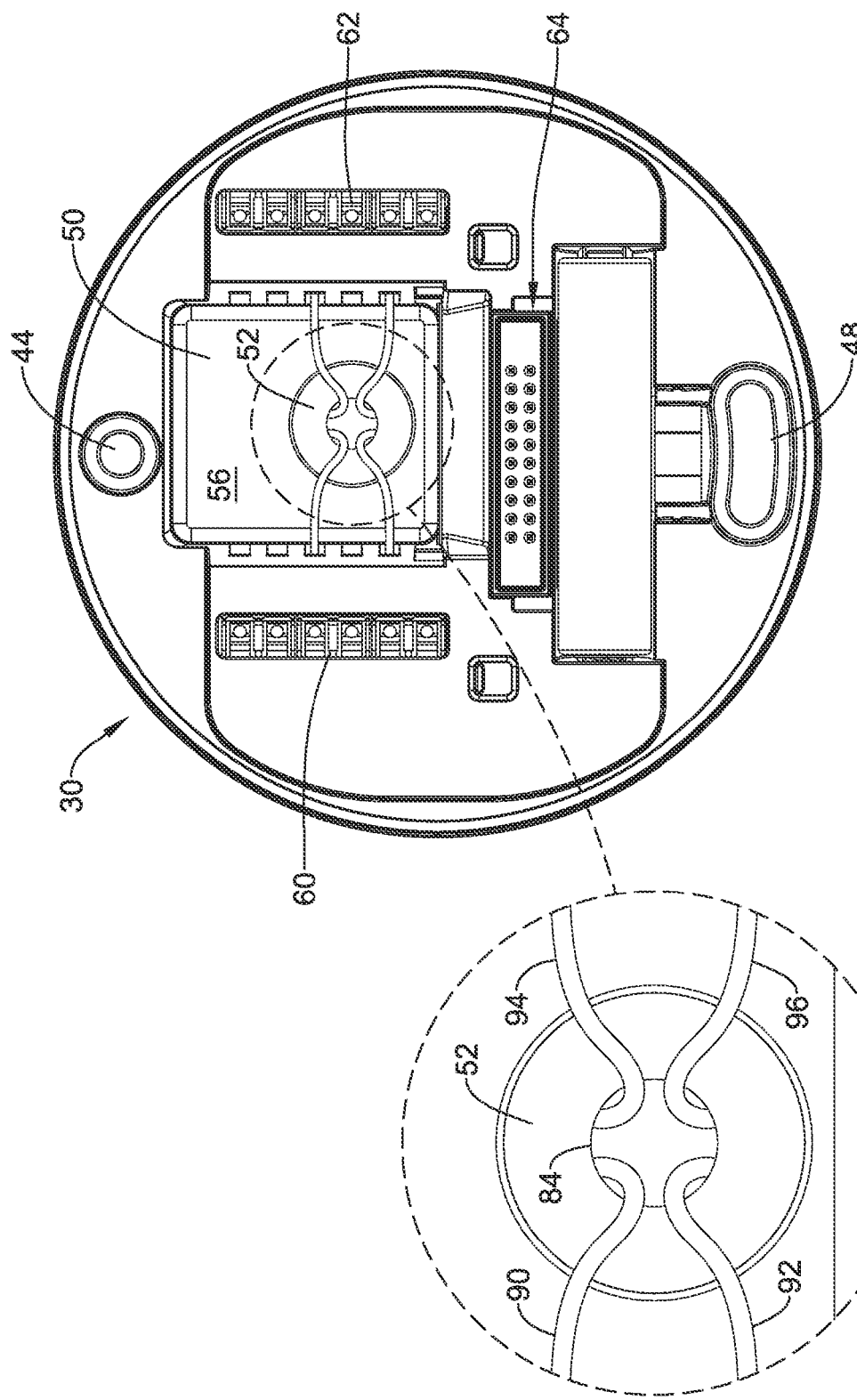
FIG. 3 is a front view of the illustrative wall plate assembly of FIG. 2.

FIG. 2 is an exploded perspective view showing the illustrative HVAC controller 10 separated from its wall plate assembly 30. FIG. 3 provides a front view of the illustrative wall plate assembly 30. In the illustrated embodiment, the wall plate assembly 30 has a front side 32 and a rear or back side 34. The wall plate assembly 30 includes a front plate 36 and a rear plate 38. In use, it will be appreciated that the front plate 36 and the rear plate 38 may be fastened together to form the wall plate assembly 30 prior to the wall plate assembly 30 being fastened to a wall or other vertical building surface. In some instances, the rear plate 38 may be fastened to the front plate 36 via one or more screws or other fasteners 78 (FIG. 4) that can pass through apertures 40 formed within the rear plate 38 and extend into the front plate 36. In another example, the rear plate 38 may be fastened to the front plate 36 by a mechanical snap-type interference connection. These are just some examples.

Once assembled, the wall plate assembly 30 may be fastened to a wall or other vertical building surface. In some embodiments, as illustrated, the rear plate 38 may include an upper aperture 42 that corresponds with an upper aperture 44 formed within the front plate 36. Similarly, the rear plate 38 may include a lower adjustment aperture 46 that corresponds with a lower adjustment aperture 48 formed within the front plate 36. As illustrated, the lower adjustment apertures 46, 48 may be elongate, thereby permitting small rotational adjustments of the wall plate assembly 30 relative to a pivot point extending through the upper apertures 42, 44.

The illustrative front plate 36 includes a recessed portion 50 and an aperture 52 that is formed within the recessed portion 50. The recessed portion 50 is recessed towards the rear plate 38, i.e., away from the front side 32 of the wall plate assembly 30, and is sized and configured to fit into an aperture 54 that is formed within the rear plate 38. The aperture 52 that is formed within the recessed portion 50 is at least partially aligned with the aperture 54 that is formed within the rear plate 38 so that wires can pass through aperture 54 and aperture 52 to be connected to a terminal block (see below) of the wall plate assembly 30.

FIG. 3 shows several wires 90, 92, 94 and 96 extending through an air flow barrier aperture 84 that at least partially aligns with the aperture 52 formed in the recessed portion 50. As illustrated, the wires 90 and 92 extend to and connect with the wire connection block 60 while the wires 94 and 96 extend to and connect with the wire connection block 62. FIG. 3 shows that while the air flow barrier aperture 84 is smaller than the aperture 52 formed in the recessed portion 50, the wires 90, 92, 94, 96 can easily fit through, as the air flow barrier aperture 84 is sized to accommodate any number of wires, and/or to accommodate wires being pushed through in a bunch, or doubled over. While four wires 90, 92, 94, 96 are illustrated, it will be appreciated that in some cases, only two wires may be used. In some cases, six, eight or more wires may be used, depending on the particular HVAC system and its control requirements.

The air flow barrier aperture 84 may be considered as having a cross-sectional area calculated as pi times its radius squared. The wires 90, 92, 94, 96 may be considered as having cross-sectional areas that, in combination, consume a portion of the cross-sectional area of the air flow barrier 80. In some embodiments, the wires in total may consume up to about 50 percent, up to about 60 percent, up to about 70 percent, up to about 80 percent or even up to about 90 percent of the cross-sectional area of the air flow barrier 80. Alternatively, the wires in total may leave a void space equal to at least about 10 percent, at least about 20 percent, at least about 30 percent, at least about 40 percent or at least about 50 percent of the cross-sectional area of the air flow barrier 80.

Figure 4:
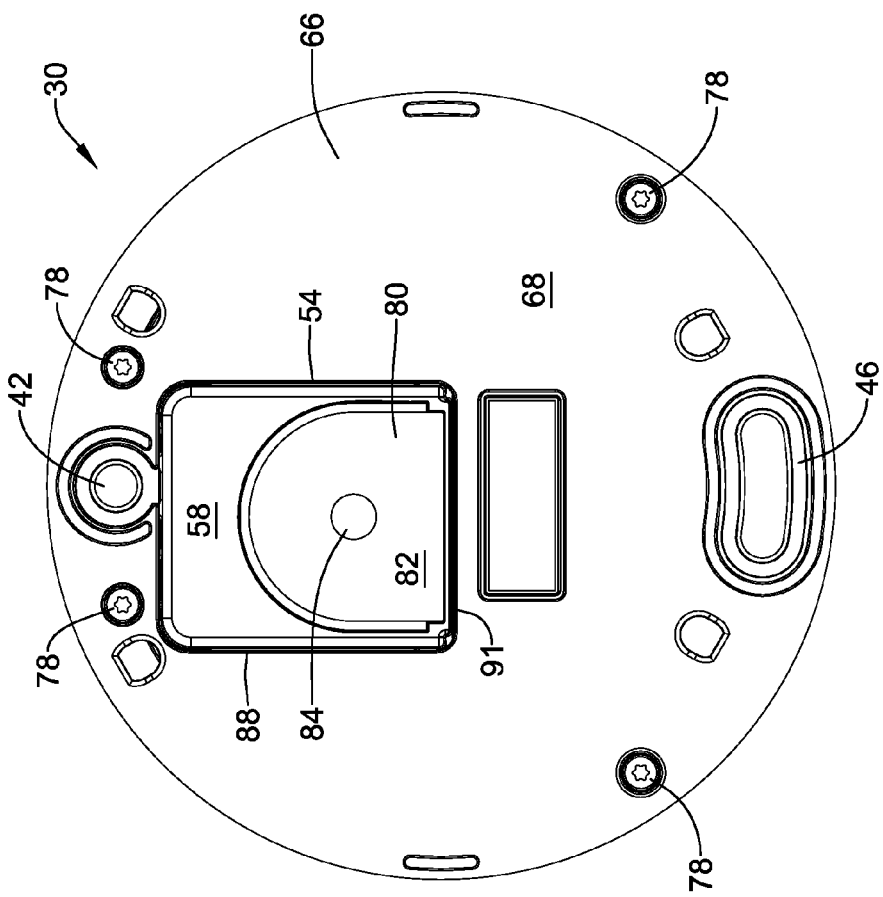
FIG. 4 is a back view of the illustrative wall plate assembly of FIG. 2.

In some embodiments, the recessed portion 50 may be considered as being or forming an aperture defining region of the wall plate assembly 30. It will be appreciated that the recessed portion 50 may include a front facing surface 56 (FIG. 3) that faces towards the front side 32 of the wall plate assembly 30 and a rear facing surface 58 (FIG. 4) that faces towards the back side 32 of the wall plate assembly 30. As seen in FIG. 4, the rear plate 38 includes a back surface 66 including one or more wall engaging regions 68. In some embodiments, substantially all of the back surface 66 may be considered as being wall engaging regions 68. In other cases, the back surface 66 may have two or more feet that are configured to engage the wall.

In use, it will be appreciated that the wall plate assembly 30 may be configured to accommodate wires extending from the HVAC system. The wires may be electrically coupled to the wall plate assembly 30, which in turn provides electrical connections to the HVAC controller 10. FIG. 3 is a front view of the wall plate assembly 30 and illustrates components that provide the aforementioned electrical connections. The front plate 36 includes a wire connection block 60 and a wire connection block 62. Each of the wire connection block 60 and wire connection block 62 is configured to provide an electrical connection with each of a plurality of wires (not illustrated) extending from the HVAC system, through the wall of the building, and through the aperture 52. The wall plate assembly 30 may also include a connector 64 that is accessible from the front side 32 of the wall plate assembly 30 and that is configured to connect to a corresponding connector on the HVAC controller 10 to provide electrical signals between the wall plate assembly 30 and the HVAC controller 10 when the HVAC controller 10 is connected to the wall plate assembly 30.

Figure 5:
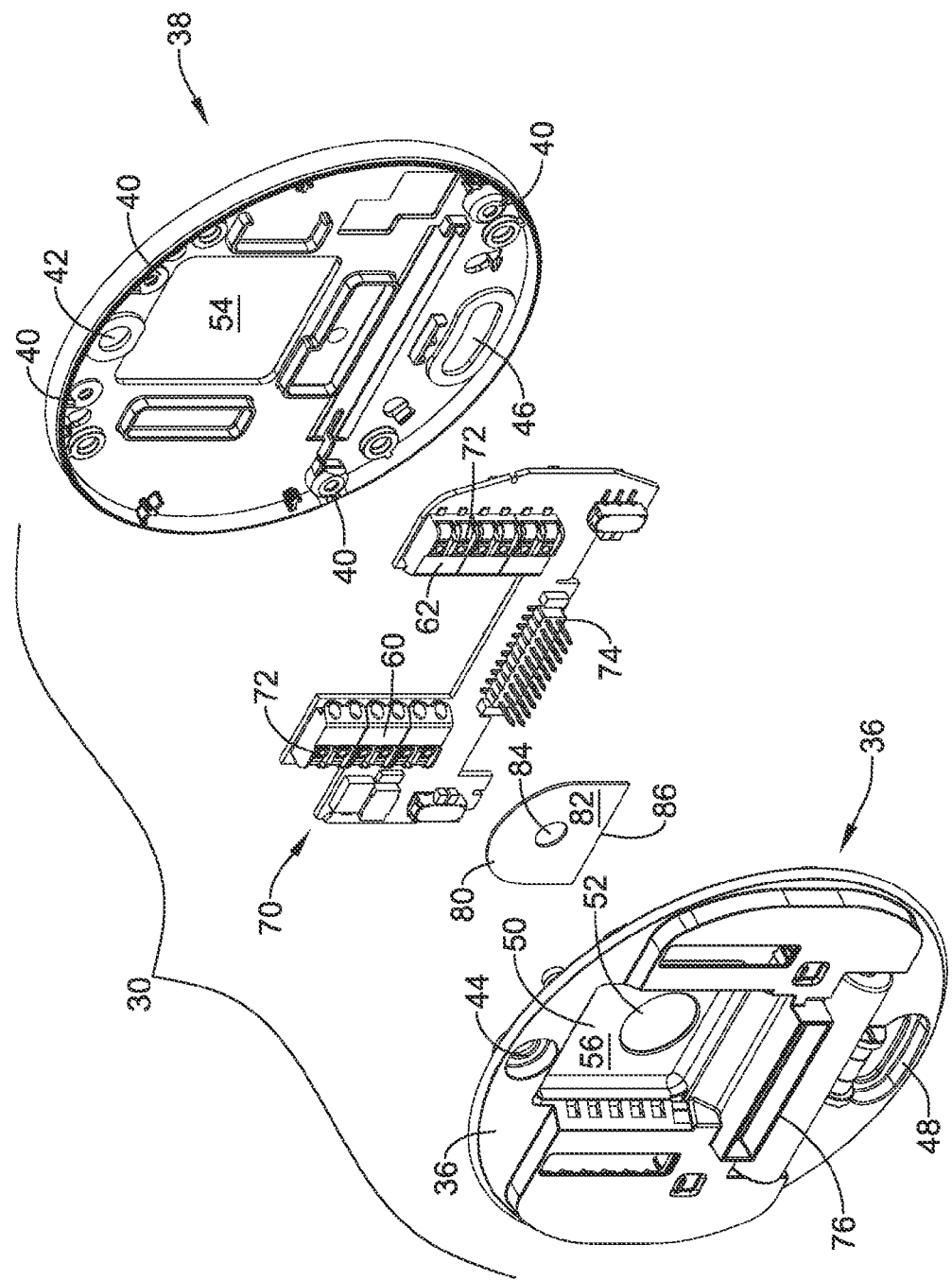
FIG. 5 is an exploded perspective view of the illustrative wall plate assembly of FIG. 2.

With reference to FIG. 5, the wall plate assembly 30 may include an electrical board 70 (e.g. printed circuit board) that fits between the front plate 36 and the rear plate 38. The electrical board 70 may include a plurality of wiring terminals 72 that in combination form the wire connection block 60 and the wire connection block 62. The electrical board 70 may also include a plurality of pins 74 that extend through a rectilinear opening 76 formed within the front plate 36 and form, in combination with the rectilinear opening 76, the connector 64. While not expressly illustrated, the electrical board 70 may include the circuitry that connects the wiring terminals 72 of the wire connection blocks 60, 62 to the plurality of pins 74. The electrical board 70 may also include additional circuitry and other electrical components as desired, such as relays, filters, a power storage element, wireless communication circuitry, etc., as desired.

When the wall plate assembly 30 is secured to a wall, typically the wires extending from the HVAC system exit the wall through a roughly-formed hole that is frequently larger than strictly necessary to accommodate the wires themselves. In some cases, particularly when the HVAC fan is running and/or when the fan cycles on and off, there can be air pressure changes within the wall relative to the air pressure in the room, meaning that positive or negative air currents may form in and near the hole in the wall. These air currents can potentially interfere with temperature readings taken by one or more temperature sensors within the HVAC controller 10. Moreover, and in some cases, the HVAC controller 10 is configured to adjust internal temperature readings taken by one or more internal temperature sensors to account for heat generation by components within the HVAC controller 10. Such air currents, if allowed to enter into the thermostat housing in sufficient quantity, can interfere with these adjustments, which can in some cases reduce the temperature control accuracy of the HVAC controller, reduce the comfort provided to the user, and/or reduce the energy efficiency that can be achieved by the HVAC system.

Figure 6:
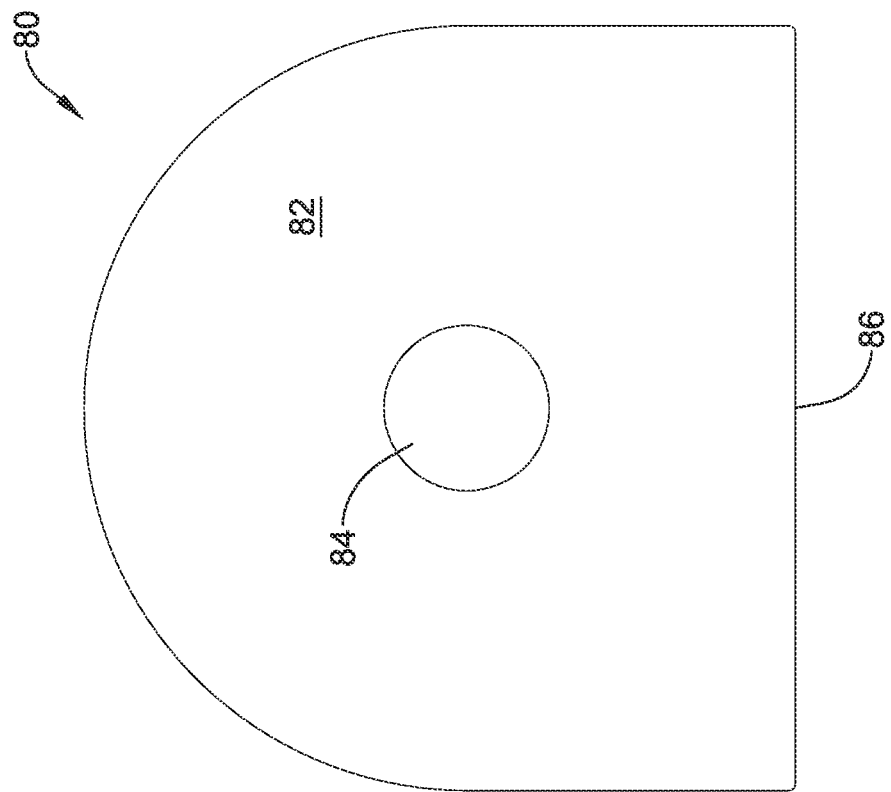
FIG. 6 is a front view of the illustrative air flow barrier shown in FIG. 2.
Figure 7:
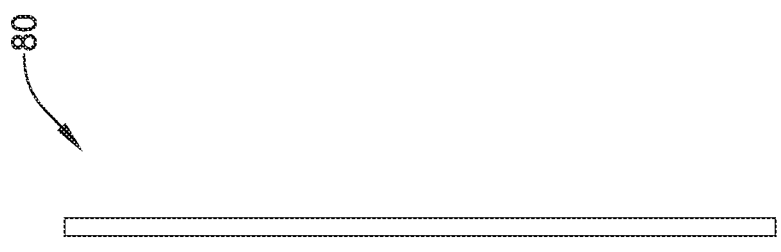
FIG. 7 is a side view of the illustrative air flow barrier shown in FIG. 2.

Accordingly, and in some embodiments, the HVAC controller 10 may include an air flow barrier 80. The air flow barrier is visible in FIGS. 4 and 5, and is best illustrated in FIGS. 6 and 7. The illustrative air flow barrier 80 may include a barrier surface 82 and an air flow barrier aperture 84 that is sized to accommodate wires expected to pass through the aperture 52 formed in the recessed portion 50 of the front plate 36. In some instances, the air flow barrier aperture 84 may be smaller than the aperture 52 formed in the recessed portion 50. The air flow barrier 80 may be secured to the recessed portion 50 of the front plate 36. In some cases, the air flow barrier 80 may be secured to the front facing surface 56 of the recessed portion 50. In some cases, as for example shown in FIG. 4, the air flow barrier 80 may be secured to the rear facing surface 58 of the recessed portion 50.

In some embodiments, the air flow barrier 80 may include a linear edge 86. In some instances, the linear edge 86 may aid positioning of the air flow barrier 80 on the recessed portion 50. In some instances, the recessed portion 50 may include a perimeter 88 having a lower edge 91 that is substantially straight. By aligning the linear edge 86 with the lower edge 91, one can help ensure that the air flow barrier aperture 84 is appropriately aligned with the aperture 52 formed in the recessed portion 50.

In some instances, the air flow barrier 80 may be formed of a flexible and resilient material that can accommodate the wires extending through the air flow barrier aperture 84. In other instances, the air flow barrier 80 may be formed of a stiff and/or non-resilient material. In some cases, the air flow barrier 80 may be a polymeric sheet and is adhesively secured to the recessed portion 50. When so provided, it is contemplated that any desired adhesive may be used to secure the air flow barrier 80 in position. For example, a pressure sensitive adhesive may be used. In some embodiments, the air flow barrier 80 may be sonic welded to the recessed portion 50. In some cases, the air flow barrier 80 may be two-part injection molded with the recessed portion 50. In some cases, the air flow barrier may be formed of or otherwise include polyurethane, Mylar, cellophane, acrylic, metal, ceramic, and/or any other suitable material as desired. As illustrated in FIG. 7, the air flow barrier 80 may be a thin sheet. In some embodiments, while not illustrated, additional barriers such as a foam layer may be disposed behind the wall plate assembly 30, if desired.

The air flow barrier 80 may be secured in place using any desired techniques. For example, in some embodiments the air flow barrier 80 may be attached to the front plate 36 using a separate retainer part (not shown). In some embodiments, the air flow barrier 80 may be trapped or captured between the front plate 36 and the rear plate 38. In some embodiments, the air flow barrier 80 may be secured in place using a combination of techniques.

Figure 8:
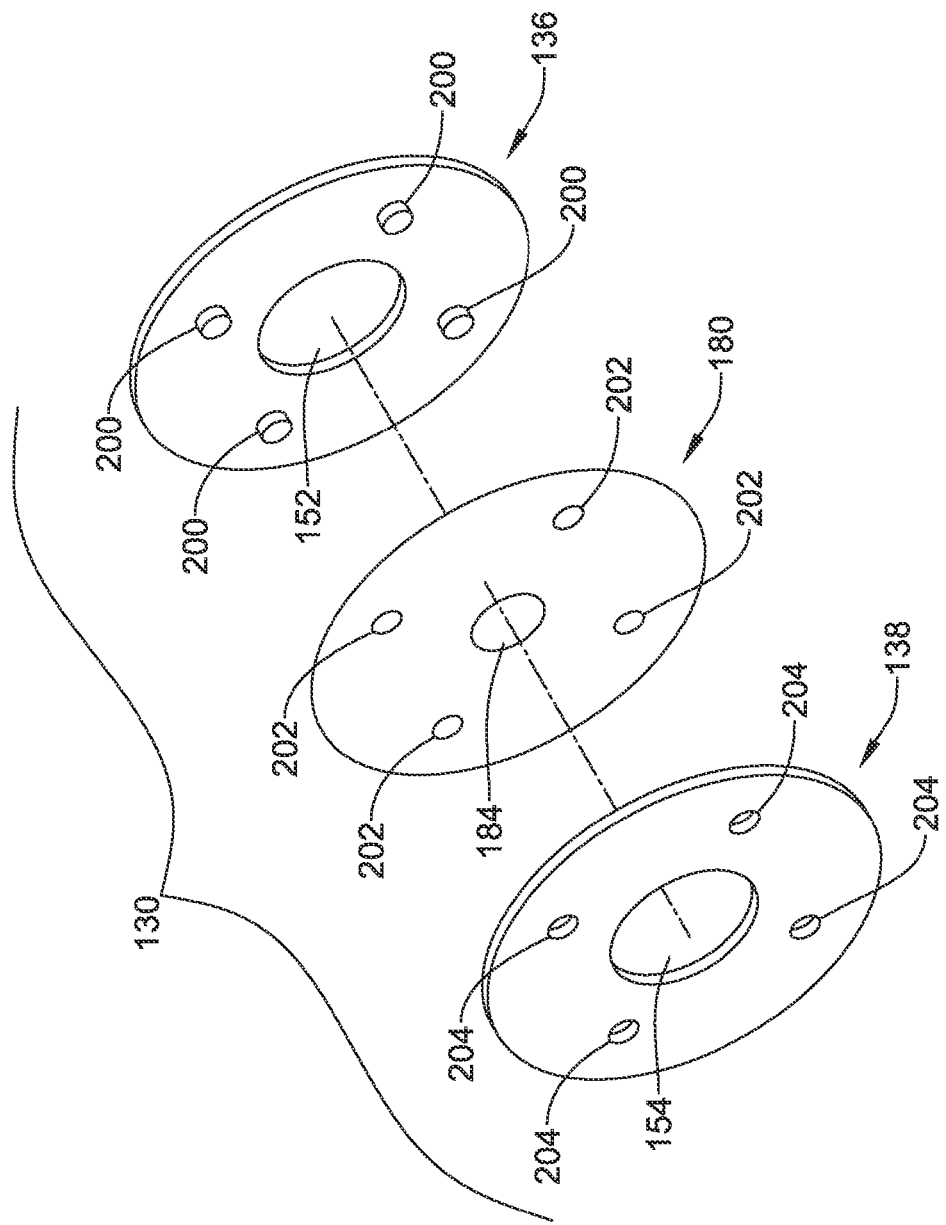
FIG. 8 is an exploded perspective schematic view of a wall plate assembly in accordance with an illustrative embodiment of the present disclosure.

FIG. 8 provides an exploded perspective schematic illustration of a wall plate assembly 130 that includes a front plate 136 having an aperture 152 and a rear plate 138 having an aperture 154. An air flow barrier 180 is disposed between the front plate 136 and the rear plate 138 and includes an air flow barrier aperture 182 that is generally smaller than the aperture 152 formed in the front plate 136 and the aperture 154 formed in the rear plate 138 and is generally aligned with the apertures 152, 154 such that wires can be fed through the wall plate assembly 130. The front plate 136 includes several protrusions 200 that help to secure the air flow barrier 180 in place. The protrusions 200 extend through mounting apertures 202 formed in the air flow barrier 180 and fit into corresponding indentations 204 formed in the rear plate 138. In some embodiments, the indentations 204 may instead be holes.

It should be understood that this disclosure is, in many respects, only illustrative. Changes may be made in details, particularly in matters of shape, size, and arrangement of steps without exceeding the scope of the disclosure. This may include, to the extent that it is appropriate, the use of any of the features of one example embodiment in other example embodiments. The scope is, of course, defined in the language in which the appended claims are expressed.

We claim:

1. A wall plate assembly for an Heating, Ventilation, and/or Air Conditioning (HVAC) controller, the wall plate assembly comprising:
   a front side;
   a back side, the back side of the wall plate assembly having one or more wall engaging regions for engaging a wall;
   an aperture defining region defining an aperture that extends between the front side to the back side of the wall plate assembly, wherein the aperture defining region is spaced inward toward the front side from the one or more wall engaging regions of the back side of the wall plate assembly;
   one or more wiring terminals accessible from the front side of the wall plate assembly for connecting one or more wires;
   an electrical connector situated on the front side of the wall plate assembly that is configured to electrically connect to an electrical connector of an HVAC controller when the HVAC controller is secured to the wall plate assembly; and
   an air flow barrier mechanically secured to the front side or back side of the wall plate assembly and over the aperture in the wall plate assembly, the air flow barrier defining an air flow barrier aperture that is smaller than the aperture of the wall plate assembly and that at least partially overlaps the aperture of the wall plate assembly.

2. The HVAC controller assembly of claim 1, wherein the air flow barrier is adhesively secured to the aperture defining region of the wall plate assembly.

3. The HVAC controller assembly of claim 1, wherein the air flow barrier is sonic welded to the aperture defining region of the wall plate assembly.

4. The HVAC controller assembly of claim 1, wherein the air flow barrier is two-part injection molded with the aperture defining region of the wall plate assembly.

5. The HVAC controller assembly of claim 1, wherein the air flow barrier comprises polyurethane.

6. The HVAC controller assembly of claim 1, wherein the air flow barrier comprises Mylar.

7. The HVAC controller assembly of claim 1, wherein the air flow barrier comprises a flexible and resilient material.

* * * * *